US009516781B2

(12) United States Patent
Ray (10) Patent No.: US 9,516,781 B2
(45) Date of Patent: Dec. 6, 2016

(54) FIBER OPTIC SHELF WITH A REMOVABLE ROOF PANEL

(71) Applicant: All Systems Broadband, Inc., Livermore, CA (US)

(72) Inventor: Craig Dwayne Ray, Fuquay-Varina, NC (US)

(73) Assignee: All Systems Broadband, Inc., Livermore, CA (US)

( * ) Notice: Subject to any disclaimer, the term of this patent is extended or adjusted under 35 U.S.C. 154(b) by 31 days.

(21) Appl. No.: 14/626,434

(22) Filed: Feb. 19, 2015

(65) Prior Publication Data

US 2016/0249481 A1 Aug. 25, 2016

(51) Int. Cl.
*H05K 7/18* (2006.01)
*H05K 7/14* (2006.01)
*G02B 6/44* (2006.01)

(52) U.S. Cl.
CPC ............ *H05K 7/186* (2013.01); *G02B 6/4455* (2013.01); *H05K 7/1411* (2013.01)

(58) Field of Classification Search
CPC ... G02B 6/4455; G02B 6/4452; G02B 6/4446; G02B 6/3897; G02B 6/444; G02B 6/4453; H04Q 1/06; H04Q 1/023; H04Q 1/142; H04Q 1/021; H05K 7/186; H05K 7/1411
USPC ....................................................... 385/135
See application file for complete search history.

(56) References Cited

U.S. PATENT DOCUMENTS

| | | | |
|---|---|---|---|
| 5,119,459 A | 6/1992 | Meyerhoefer et al. | |
| 6,203,130 B1 | 3/2001 | Montgelas et al. | |
| 6,600,656 B1 | 7/2003 | Mori et al. | |
| 6,944,389 B2 | 9/2005 | Giraud et al. | |
| 7,031,588 B2 * | 4/2006 | Cowley ............... | G02B 6/4455 312/323 |
| 7,509,015 B2 | 3/2009 | Murano et al. | |
| 7,570,860 B2 * | 8/2009 | Smrha ................. | G02B 6/4452 385/134 |
| 7,570,861 B2 * | 8/2009 | Smrha ................. | G02B 6/4452 385/134 |
| 7,613,376 B2 * | 11/2009 | Wright ................ | G02B 6/4478 385/134 |
| 7,764,859 B2 * | 7/2010 | Krampotich ......... | G02B 6/4455 385/135 |
| 7,873,253 B2 * | 1/2011 | Smrha ................. | G02B 6/4452 385/134 |

(Continued)

*Primary Examiner* — Patrick Hawn
(74) *Attorney, Agent, or Firm* — Murphy, Bilak & Homiller, PLLC (57) ABSTRACT

A shelf includes a receptacle having first and second outer sidewalls, a rear sidewall extending between the sidewalls, a pair of tracks extending along lower edge sides of the sidewalls, and a roof extending between upper edge sides of the sidewalls. The roof includes a permanent section and a removable front access panel. The shelf further includes a drawer, having a floor, two side-rails extending along opposite edge sides of the floor, and a front panel extending away from a front edge side of the floor. The receptacle is configured to slidably receive the drawer with the tracks being engaged with the side-rails. The removable front access panel includes a pair of slats configured to engage with the permanent section of the roof and a pair of tabs configured to fixedly attach the removable front access panel to the first and second outer sidewalls of the receptacle.

12 Claims, 6 Drawing Sheets

(56) References Cited

U.S. PATENT DOCUMENTS

| | | |
|---|---|---|
| 8,154,886 B2 | 4/2012 | Hendrix et al. |
| 8,280,216 B2 | 10/2012 | Cooke et al. |
| 8,320,126 B2 | 11/2012 | Replogle et al. |
| 8,385,710 B2 | 2/2013 | Wong et al. |
| 8,452,148 B2 | 5/2013 | Cooke et al. |
| 8,526,774 B2 | 9/2013 | Krampotich et al. |
| 8,554,042 B2* | 10/2013 | Ruiz .................... G02B 6/4452 385/135 |
| 8,565,572 B2* | 10/2013 | Krampotich ......... G02B 6/4452 385/135 |
| 2008/0063350 A1* | 3/2008 | Trebesch ............. G02B 6/4452 385/135 |
| 2008/0085093 A1* | 4/2008 | Krampotich ......... G02B 6/4455 385/135 |
| 2008/0175552 A1* | 7/2008 | Smrha .................. G02B 6/4452 385/135 |
| 2009/0022470 A1* | 1/2009 | Krampotich ......... G02B 6/4455 385/135 |
| 2010/0111482 A1* | 5/2010 | Smrha .................. G02B 6/4452 385/135 |
| 2011/0206336 A1* | 8/2011 | Krampotich ......... G02B 6/4455 385/135 |
| 2012/0020634 A1* | 1/2012 | Smrha .................. G02B 6/4452 385/135 |
| 2013/0039629 A1* | 2/2013 | Krampotich ......... G02B 6/4455 385/135 |
| 2014/0003783 A1* | 1/2014 | Smrha .................. G02B 6/4452 385/135 |
| 2014/0178025 A1* | 6/2014 | Krampotich ......... G02B 6/4452 385/135 |
| 2015/0131958 A1* | 5/2015 | Smrha .................. G02B 6/4452 385/135 |
| 2015/0219858 A1* | 8/2015 | Timmins ............... G02B 6/4452 385/135 |
| 2015/0338598 A1* | 11/2015 | Smrha .................. G02B 6/4452 385/135 |

* cited by examiner

FIBER OPTIC SHELF WITH A REMOVABLE ROOF PANEL

TECHNICAL FIELD

This application generally relates to enclosures for fiber optic hardware, and more particularly relates to accessibility features for fiber optic enclosures that are secured to a vertical rack.

BACKGROUND

Today's communication networks provide information transport of voice, video and data to both residential and commercial customers with more and more of those customers being connected by fiber optic cables. Current network designs differ among carriers, or service providers, and are influenced by such variables as legacy equipment and architectures, past and present infrastructure investments and network types. These network types include the Gigabit Passive Optical Network (GPON), the Ethernet Passive Optical Network (EPON) and the Hybrid Fiber-Coaxial (HFC) networks, to name just a few.

A fiber optic cable (or "fiber bundle") includes a number of individual optical fibers, each of which may be used to transmit significant quantities of information. Some fiber optic network designs include the use of passive components such as optical splitters and wavelength-division multiplexing (WDM) filters as a way of creating and deploying a more cost effective and efficient access network.

Telecommunications equipment racks often include sliding support shelves, which typically include sliding drawers, for housing and organizing optical hardware and optical fiber cables. These shelves are designed to protect the optical equipment and optical fiber cables, but should also be designed to provide convenient access to the optical components such that installations can be effectuated in a timely manner.

Telecommunication equipment racks and sliding support shelf systems are typically designed with space efficiency in mind. A space efficient design maximizes the density of fiber optic cabling and the corresponding optical components, which can be used to increase the bandwidth of a given network. For example, an equipment rack may be configured with a plurality of shelves mounted in a vertical stack. To maximize the space efficiency of the rack, the vertical spacing between each of the shelves can be minimized, e.g., by designing the rack and shelves to conform to a standardized spacing scheme. A maximum density is achieved by selecting a standardized spacing scheme that leaves little or no space in between the shelves. However, such a spacing scheme makes it difficult to access some of the interior space within the shelves despite the fact that the shelves have a sliding drawer.

SUMMARY

A shelf for storing fiber optic hardware or cabling is disclosed. According to an embodiment, the shelf includes a receptacle having first and second outer sidewalls spaced apart and parallel to one another, a rear sidewall extending between the first and second outer sidewalls, a pair of tracks extending along lower edge sides of the first and second sidewalls and facing one another, and a roof extending between upper edge sides of the first, second and rear sidewalls. The roof includes a permanent section and a removable front access panel. The permanent section of the roof adjoins the rear sidewall. The removable front access panel is spaced apart from the rear sidewall by the permanent section. The receptacle further includes a drawer having a floor, two side-rails extending along opposite edge sides of the floor, a front panel extending away from a front edge side of the floor and being substantially perpendicular to the floor. The receptacle is configured to slidably receive the drawer with the tracks being engaged with the side-rails. The removable front access panel of the receptacle includes a pair of slats configured to engage with the permanent section of the roof and a pair of tabs configured to fixedly attach the removable front access panel to the first and second outer sidewalls of the receptacle.

A rack assembly for storing fiber optic hardware or cabling is disclosed. According to an embodiment, the rack assembly includes a frame, having two spaced apart members, each of the members having an array of fastener perforations, the fastener perforations being spaced apart from one another at regular intervals. The rack assembly further includes a plurality of shelves being fixedly attached to the frame by fasteners secured in the fastener perforations of each spaced apart member. A first one of the shelves includes a receptacle, having first and second outer sidewalls spaced apart and parallel to one another, a rear sidewall extending between the first and second outer sidewalls, a pair of tracks extending along lower edge sides of the first and second sidewalls and facing one another, and a roof extending between upper edge sides of the first, second and rear sidewalls. The roof includes a permanent section and a removable front access panel. The permanent section of the roof adjoins the rear sidewall. The removable front access panel is spaced apart from the rear sidewall by the permanent section. The first one of the shelves further includes a drawer, having a floor, two side-rails extending along opposite edge sides of the floor, and a front panel extending away from a front edge side of the floor and being substantially perpendicular to the floor. The receptacle is configured to slidably receive the drawer with the tracks being engaged with the side-rails. The first shelf is covered by a vertically adjacent shelf and is spaced apart from the vertically adjacent shelf by a minimum separation distance that is determined by a vertical spacing of the fastener perforations on the frame. The removable front access panel includes a pair of tabs configured to fixedly attach the removable front access panel to the first and second outer sidewalls of the receptacle and to allow the removable front access panel to be slid away from the rear sidewall of the receptacle in a first direction that is parallel to the permanent section of the roof.

Of course, the present invention is not limited to the above features and advantages. Indeed, those skilled in the art will recognize additional features and advantages upon reading the following detailed description, and upon viewing the accompanying drawings.

DETAILED DESCRIPTION

A shelf 100 for storing fiber optic hardware or cabling is described according to various embodiments. The shelf 100 includes a receptacle 102 and a drawer 104. The receptacle 102 includes a pair of tracks 106 that engage with the tracks 108 of the drawer 104 such that the drawer 104 can slide in and out of the receptacle 102. The receptacle 102 includes a planar roof 110 that extends over and adjoins first and second outer sidewalls 112 and a rear sidewall 114 of the receptacle 102. The roof 110 includes a removable front access panel 116 and a permanent section 118. The permanent section 118 is permanently affixed to the outer sidewalls 112 and to the rear sidewall 114 of the shelf 100. The removable front access panel 116 extends to a front side of the receptacle 102 that is opposite from the rear sidewall 114. The removable front access panel 116 can be flush against the drawer 104 when the drawer 104 is completely closed so as to completely enclose an interior space of the shelf 100.

Advantageously, the removable front access panel 116 can be disengaged from the permanent section 118 of the roof 110 and can be completely removed from the shelf 100. Once removed, rear portions of the drawer 104 that would otherwise be difficult to access due to the overlap of the roof 110 and the drawer 104 are easily accessible to an installer. That is, the removable nature of the panel 116 eliminates an obstruction that makes fiber optic installations more difficult and/or time consuming.

Advantageously, the removable front access panel 116 can be fixedly attached to the receptacle 102 and can be removed from the receptacle 102 by sliding the removable front access panel 116 in a first direction (D1) (depicted in FIGS. 3 and 4) that is parallel to the permanent section 118 of the roof 110. This capability, which is a result of the structural features of the panel 116 and the shelf 100, is particularly advantageous in a vertical rack arrangement in which the shelf 100 is covered by another structure. In such a configuration, there may be little or no clearance to access a top side of the roof 110 and any fastening mechanisms that are arranged on the top side of the roof 110. The front access panel 116 described herein includes features that allow it to be affixed to the side of the shelf 100 so that access to the top side of the roof 110 is not necessary. More particularly, the removable front access panel 116 includes a pair of tabs 120 configured to fixedly attach the removable front access panel 116 (e.g., by screws, bolts, etc.) to the outer sidewalls 112 of the receptacle 102. The tabs 120 include fastener receptacles 122 with an open side that faces the rear sidewall 114 of the shelf 100. This allows a fastener to be inserted in the fastener receptacles 122 without the fastener impeding the motion of the front access panel 116 in the first direction (D1). Thus, the front access panel 116 can be removed without completely removing fasteners from the fastener receptacles 122. Further, the tabs 120 are arranged in a location that is easily accessible to an installer in a vertical rack configuration.

Figure 1:
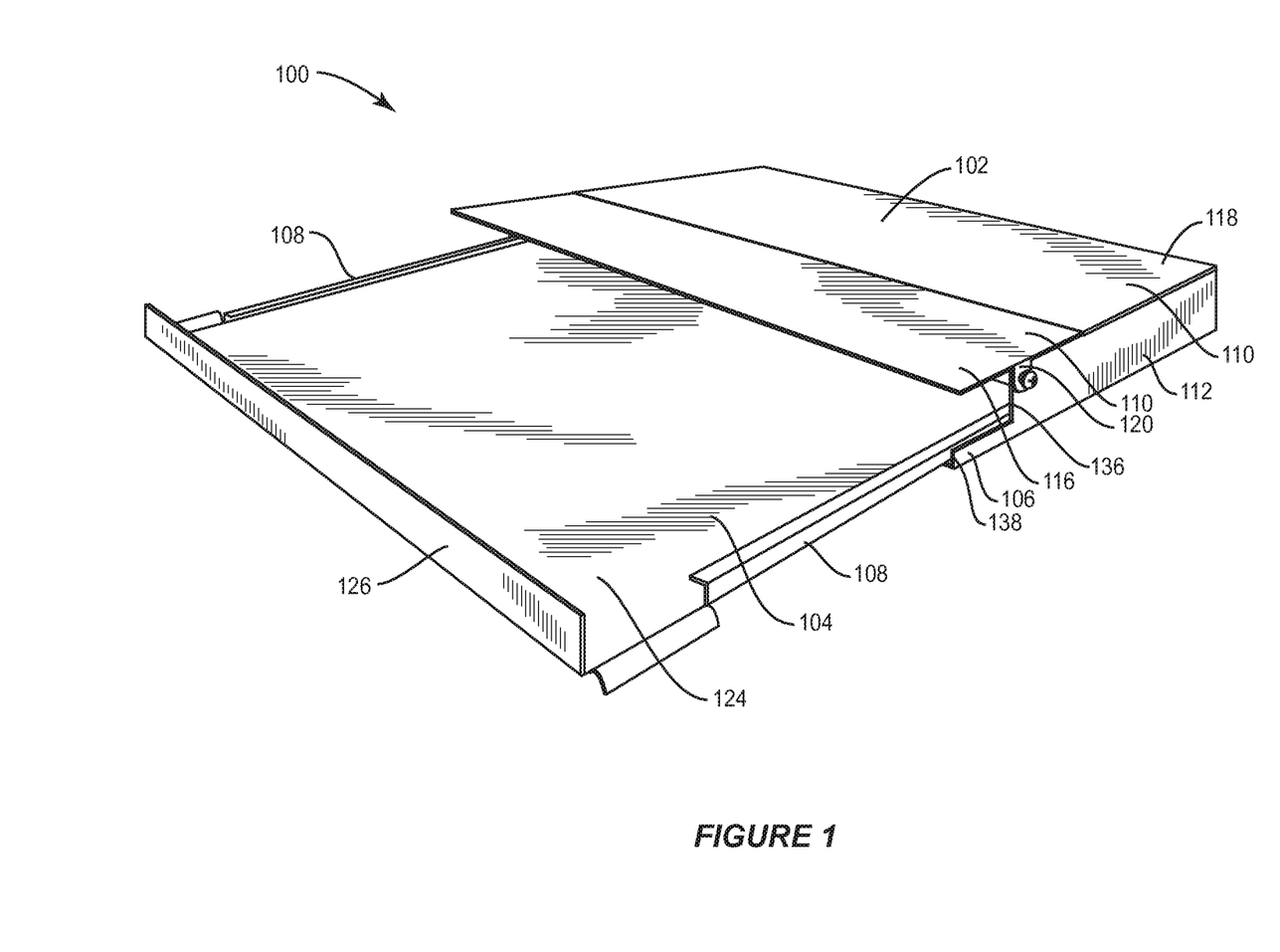
FIG. 1 depicts a shelf for storing fiber optic hardware or cabling from a diagonal perspective, according to an embodiment.
Figure 2:
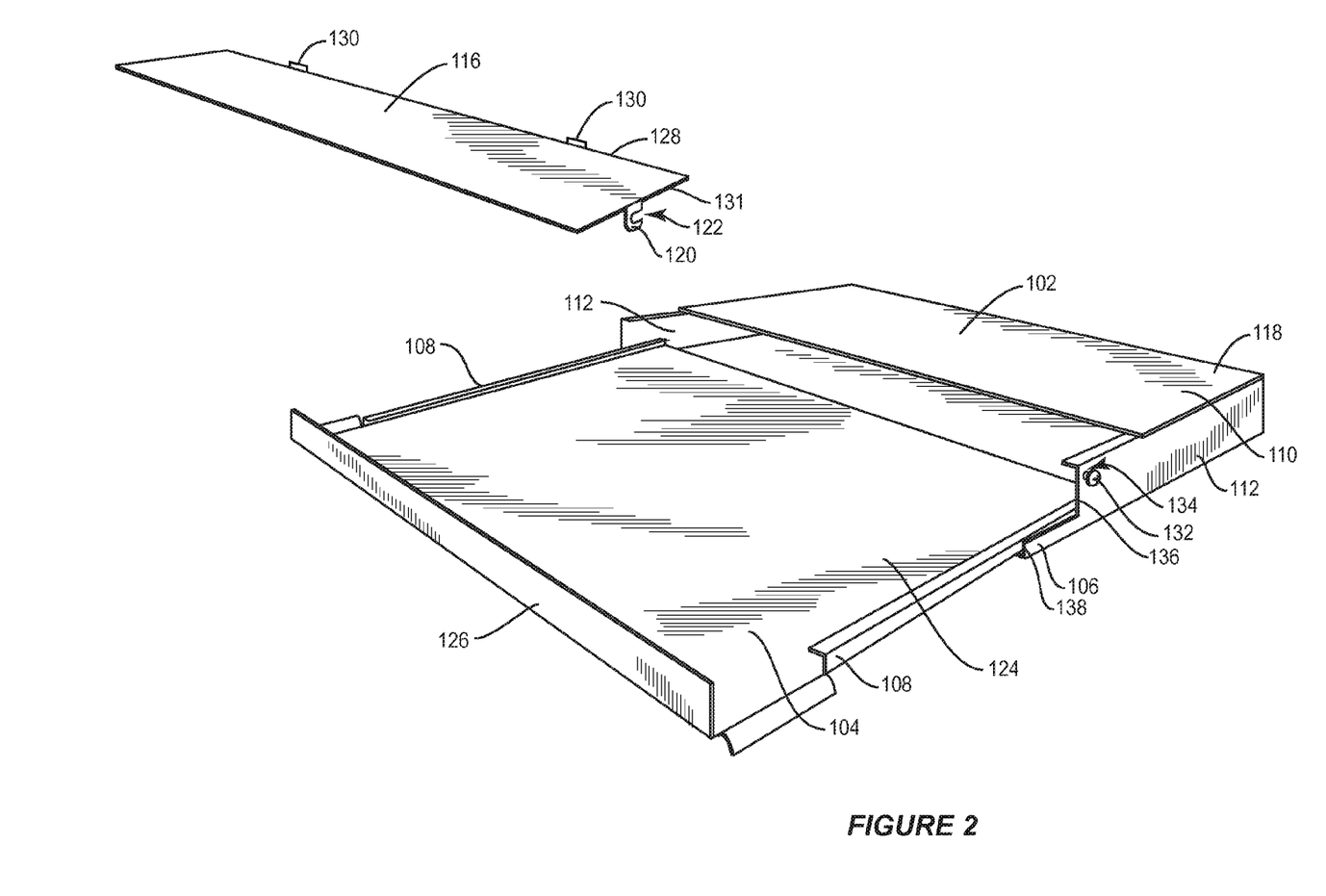
FIG. 2 depicts the shelf of FIG. 1 with the removable front access panel removed from the shelf, according to an embodiment.
Figure 3:
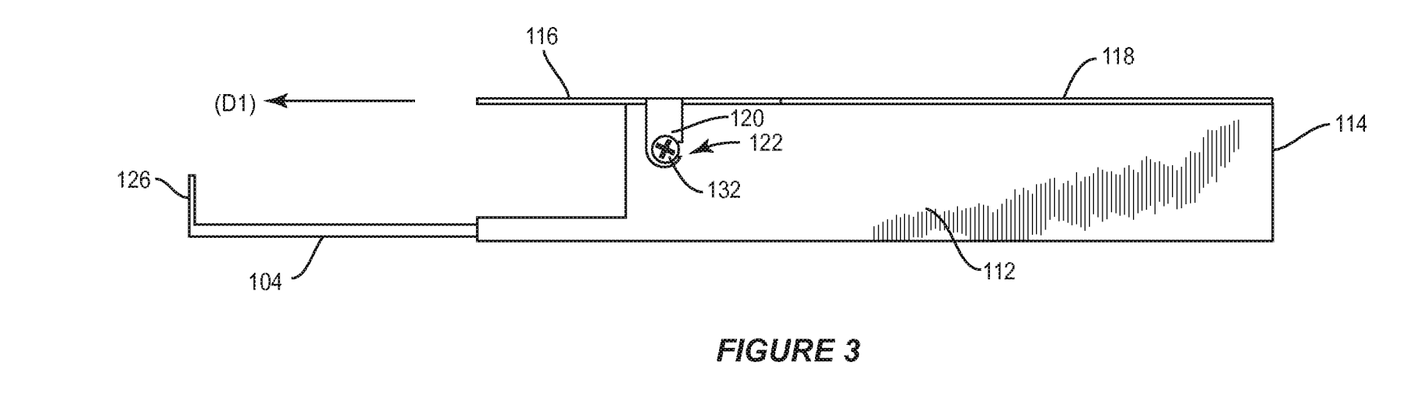
FIG. 3 depicts a shelf for storing fiber optic hardware or cabling from a side view perspective, according to an embodiment.
Figure 4:
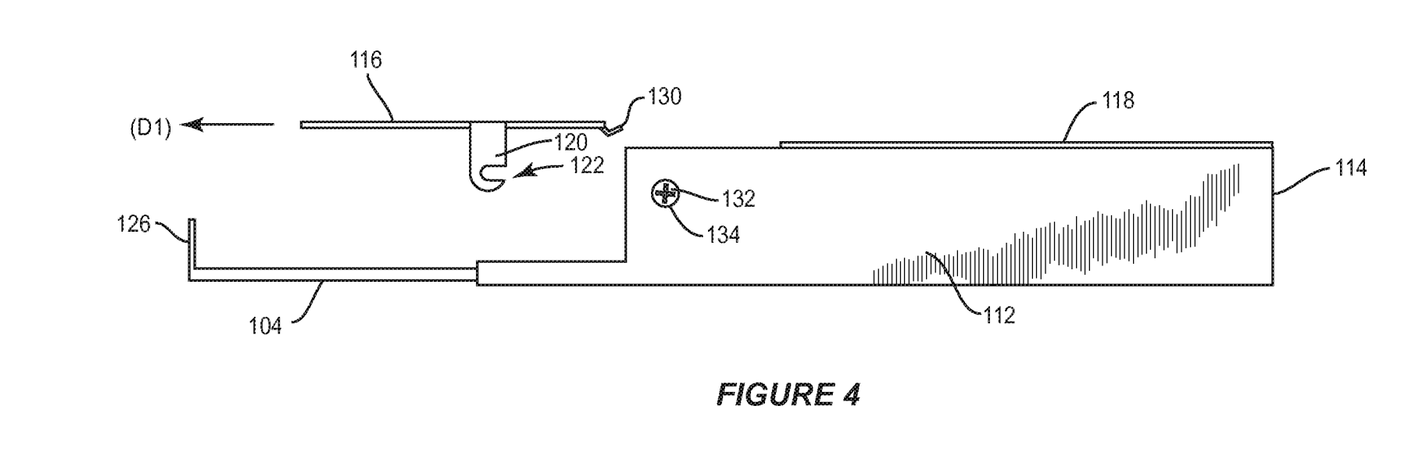
FIG. 4 depicts the shelf of FIG. 3 with the removable front access panel removed from the shelf, according to an embodiment.

Referring to FIGS. 1-4, a shelf 100 for storing fiber optic hardware or cabling is depicted. FIG. 1 depicts the shelf 100 with the removable front access panel 116 affixed to the shelf 100. FIG. 2 depicts the shelf 100 with the removable front access panel 116 removed from the shelf 100. FIGS. 3 and 4 depict corresponding side views of FIGS. 1 and 2.

The shelf 100 includes a receptacle 102 and a drawer 104. In a commonly known manner, the drawer 104 can be slid in an out of the receptacle 102. In a closed position, the drawer 104 is flush against a front side of the receptacle 102. In an open position, the drawer 104 extends out from the receptacle 102 such that a floor 124 of the drawer 104 is accessible.

The receptacle 102 includes first and second outer sidewalls 112 that are spaced apart and parallel to one another. The first and second outer sidewalls 112 may be substantially planar. The receptacle 102 further includes a rear sidewall 114 extending between the first and second outer sidewalls 112. The rear sidewall 114 is perpendicular to the first and second outer sidewalls 112. The receptacle 102 further includes a pair of tracks 106 extending along lower edge sides of the first and second outer sidewalls 112. The tracks 106 curve inward towards a center of the receptacle 102 and face one another.

The drawer 104 includes a substantially planar floor 124, and a front panel 126 extending away from a front edge side of the floor 124. According to an embodiment, the front panel 126 is perpendicular to the floor 124.

The drawer 104 additionally includes two side-rails 108 extending along opposite edge sides of the floor 124. The receptacle 102 is configured to slidably receive the drawer 104 with the tracks 106 being engaged with the side-rails 108. That is, the tracks 106 of the receptacle 102 have a geometry that complements the side-rails 108 of the drawer 104 such that the drawer 104 can be physically supported by the receptacle 102 but allowed to move toward and away from the rear sidewall 114 of the receptacle.

The receptacle 102 further includes a roof 110 extending between upper edge sides of the first and second outer sidewalls 112 and the rear sidewall 114. According to an embodiment, the roof 110 is substantially planar. The roof 110 has at least two discrete sections. A permanent section 118 of the roof 110 adjoins the rear sidewall 114 and extends between parts of the first and second outer sidewalls 112. The permanent section 118 of the roof 110 may be integrally formed with the first and second outer sidewalls 112. Alternatively, the permanent section 118 of the roof 110 may be discrete from the first and second outer sidewalls 112 and affixed to the first and second outer sidewalls 112, e.g., by screws, bolts, etc.

The roof 110 includes a removable front access panel 116 that is spaced apart from the rear sidewall 114 by the permanent section 118 of the roof 110. The removable front access panel 116 extends between the first and second outer sidewalls 112 when the panel 116 is affixed to the shelf 100. According to an embodiment, the removable front access panel 116 is rectangular. However, other geometries are possible. For example, a rear edge side 128 of the removable front access panel 116 that faces and engages with the permanent section 118 may be non-linear so as to complement a non-linear edge side of the permanent section 118.

The removable front access panel 116 includes a pair of slats 130 at the rear edge side 128. The slats 130 are small planar surfaces that are offset from the main plane formed by the front access panel 116. The slats 130 are configured to engage with the permanent section 118 of the roof 110 and therefore maintain the front access panel 116 and the permanent section 118 in a single plane when the two are engaged with one another.

The removable front access panel 116 further includes a pair of tabs 120 configured to fixedly attach the removable front access panel 116 to the first and second outer sidewalls 112 of the receptacle 102. As used herein, "fixedly attached" describes a physical connection that cannot be disrupted without the use of extraneous tools, such as a screwdriver, and/or excessive mechanical force that exceeds the mechanical strength of the material used to form the shelf 100.

According to an embodiment, the tabs 120 are arranged on outer edge sides 131 of the removable front access panel 116. The outer edge sides 131 of the removable front access panel 116 are opposite to one another and therefore the tabs 120 face one another. The tabs 120 are small, flat protections that extend perpendicular to a (main) planar section of the removable front access panel 116. The tabs 120 include fastener receptacles 122 that are configured to receive a fastener 132, such as a screw, bolt, pin, etc. For example, the receptacles 122 may be circular or semi-circular, and may have a radius that is slightly larger than a radius of the narrower cylindrical portion of the fastener 132.

The tabs 120 and the fastener receptacles 122 are configured to align with fastener perforations 134 of the first and second outer sidewalls 112 when the removable front access panel 116 is engaged with the permanent section 118 of the roof 110. Thus, the fastener 132 may be inserted in the fastener perforations 134 of the first and second outer sidewalls 112 and subsequently the removable front access panel 116 may be arranged with the fastener receptacles 122 placed around the fastener 132 with a head of the fastener 132 extending over the tabs 120. The removable front access panel 116 may be secured to the receptacle 102 by tightening the fastener 132 against the tab 120, e.g., by torqueing the fastener 132 with a screwdriver.

According to an embodiment, the slats 130 and the tabs 120 of the removable front access panel 116 are configured such that the removable front access panel 116 may be disengaged with the permanent section 118 and removed from the receptacle 102 by sliding the removable front access panel 116 in a first direction (D1) (depicted in FIGS. 3 and 4) that is parallel to the permanent section 118 of the roof 110. Because the slats 130 are offset from and parallel to the removable front access panel 116, they do not provide any resistance when the removable front access panel 116 is slid away from the rest of the receptacle 102 in the first direction (D1).

According to an embodiment, the tabs 120 are configured to allow the removable front access panel 116 to be slid away from the receptacle 102 in the first direction (D1) with a fastener 132 inserted in at least one of the fastener perforations 134 of the first and second outer sidewalls 112. This configuration can be realized by configuring the tabs 120 in a hook shape with an open side that faces the rear sidewall 114 of the receptacle 102. When the fastener 132 is tightened against the tab 120, the removable front access panel 116 cannot be pulled away from the receptacle 102 in the first direction (D1), due to the pressure applied by the fastener 132. When the fastener is loosened, the provision of the open side of the fastener receptacles 122 eliminates any resistance to the movement of the front access panel 116 in the first direction (D1) that would otherwise exist if the fastener receptacle 122 fully surrounded the fastener 132. That is, the open side of the fastener receptacles 122 allows the panel 116 to be removed from the shelf 100 without completely removing the fastener 132 from the shelf 100.

The roof 110 of the receptacle 102 may be formed from a single sheet of material (e.g., sheet metal) that is cut or broken along a line that divides the permanent section 118 from the removable front access panel 116. In this way, the removable front access panel 116 and the permanent section 118 can form a single plane when the removable front access panel 116 is engaged with the permanent section 118 of the roof 110 and fastened to the first and second outer sidewalls 112.

According to an embodiment, the shelf 100 is configured such that an underside of the removable front access panel 116 is accessible when the removable front access panel 116 is engaged with the permanent section 118 of the roof 110 and fastened to the first and second outer sidewalls 112 and the drawer 104 is completely shut. The drawer 104 is completely shut when it is moved as close to the rear sidewall 114 as possible. In contrast to a conventional shelf design in which the first and second outer sidewalls 112 extend completely underneath the roof 118, front edges 136 of the first and second outer sidewalls 112 of the shelf 100 are offset from a front side 138 of the rails 108 that is opposite the rear sidewall 114 of the receptacle 102. Thus, when the drawer 104 is closed, openings exist between the rails 108 and the underside of the removable front access panel 116. These openings allow an installer to grip the removable front access panel 116 and pull it away from the shelf 100 in the first direction (D1).

Figure 5:
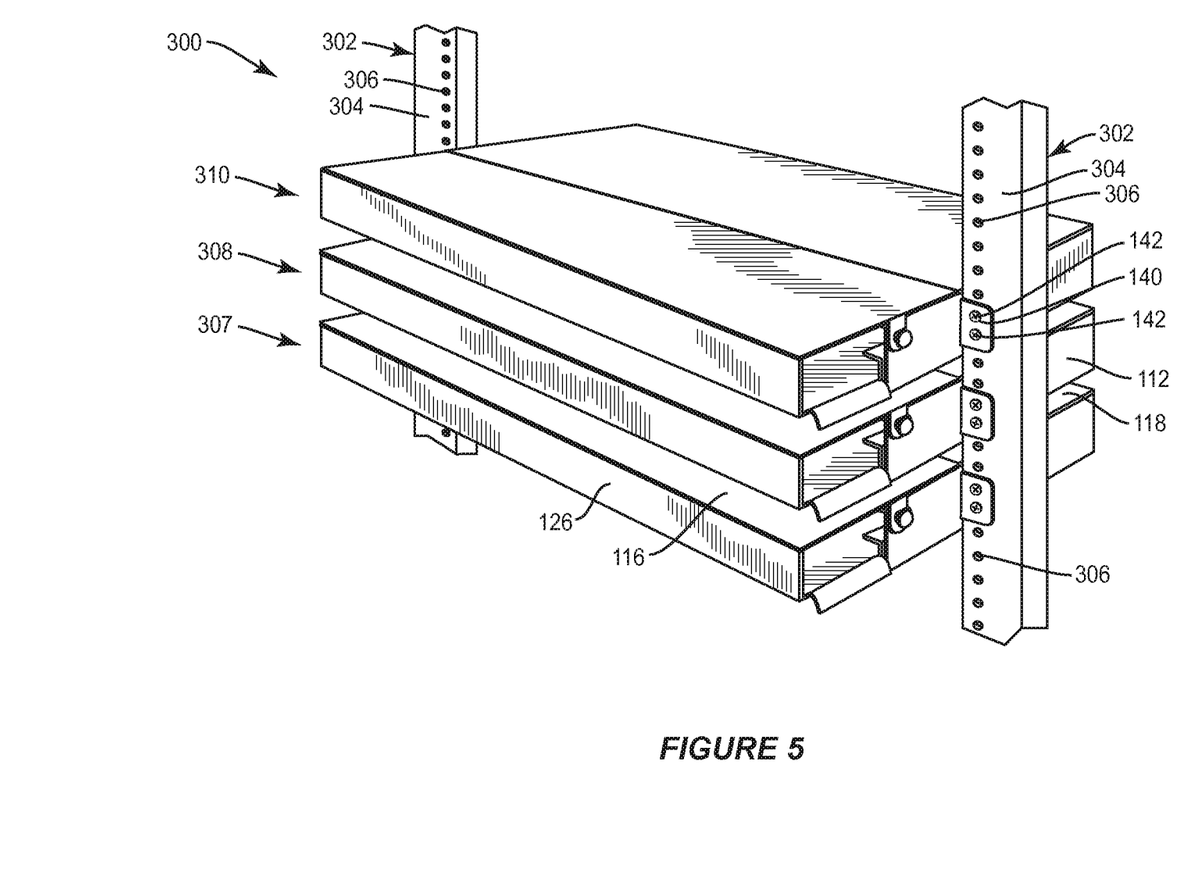
FIG. 5 depicts a rack assembly for storing fiber optic hardware or cabling from a diagonal perspective, according to an embodiment.

Referring to FIG. 5, a rack assembly 300 for storing fiber optic hardware or cabling is depicted. The rack assembly 300 is configured to accommodate a plurality of structures that accommodate fiber optic hardware or cabling, such as shelves, cabinets, etc. The rack assembly 300 includes a frame 302 having two spaced apart members 304. The spaced apart members 304 are parallel to one another and are angle-iron shaped. This angle-iron shape allows a cubic structure to be placed flush against the spaced apart members 304. The spaced apart members 304 include an array of fastener perforations 306. The fastener perforations 306 are each dimensioned to receive a standardized fastener, such as a screw, bolt, pin, etc. The fastener perforations 306 are spaced apart from one another at regular intervals. For example, the fastener perforations 306 may be spaced apart from one another by 50 mm.

The rack assembly 300 is compatible with any of a wide variety of structures having connection mechanisms that are compatible with the fastener perforations 306. For example, the shelf 100 includes a pair of mounting tabs 140 that provide such a connection mechanism. The tabs 140 extend away from the first and second outer sidewalls 112 in a direction parallel to the rear sidewall 114 of the receptacle 102. Each of the mounting tabs 140 includes a pair of fastener perforations 142 that are dimensioned similarly or identical to the fastener perforations 306 of the rack assembly 300. Further, the fastener perforations have the same vertical spacing as the fastener perforations 306 in the spaced apart members 304 of the rack 302 such that a pair of standardized fasteners, such as a screw, bolt, pin, etc. can be inserted in the fastener perforations 142, 306 and secure the shelf 100 to the spaced apart members 304.

In the rack assembly 300 of FIG. 5, a plurality of shelves 307, 308, 310 are fixedly attached to the frame 302. A middle one of the shelves 308 is fixedly attached to the frame 302 and is between the two other shelves 307, 310. An upper one of the shelves 310 is vertically adjacent to and covers the middle shelf 308. At least the middle shelf 108 is configured identically to the shelf 100 described with reference to FIGS. 1-4. The rest of the shelves 307, 310 in the plurality may be also be configured the same as the shelf 100. Alternatively, the upper shelf 310 may be any structure that is compatible with the rack assembly 300, and the advantages of the shelf 100 described herein are nonetheless realized.

As shown in FIG. 5, the middle shelf 308 is covered by the vertically adjacent shelf 310. The middle shelf 308 is spaced apart from the vertically adjacent shelf 310 by a minimum separation distance. This minimum separation distance is determined by a vertical spacing of the fastener perforations 306 on the frame 302. That is, the fastener perforations 306 provide slots that accommodate the shelves 308, 310.

Figure 6:
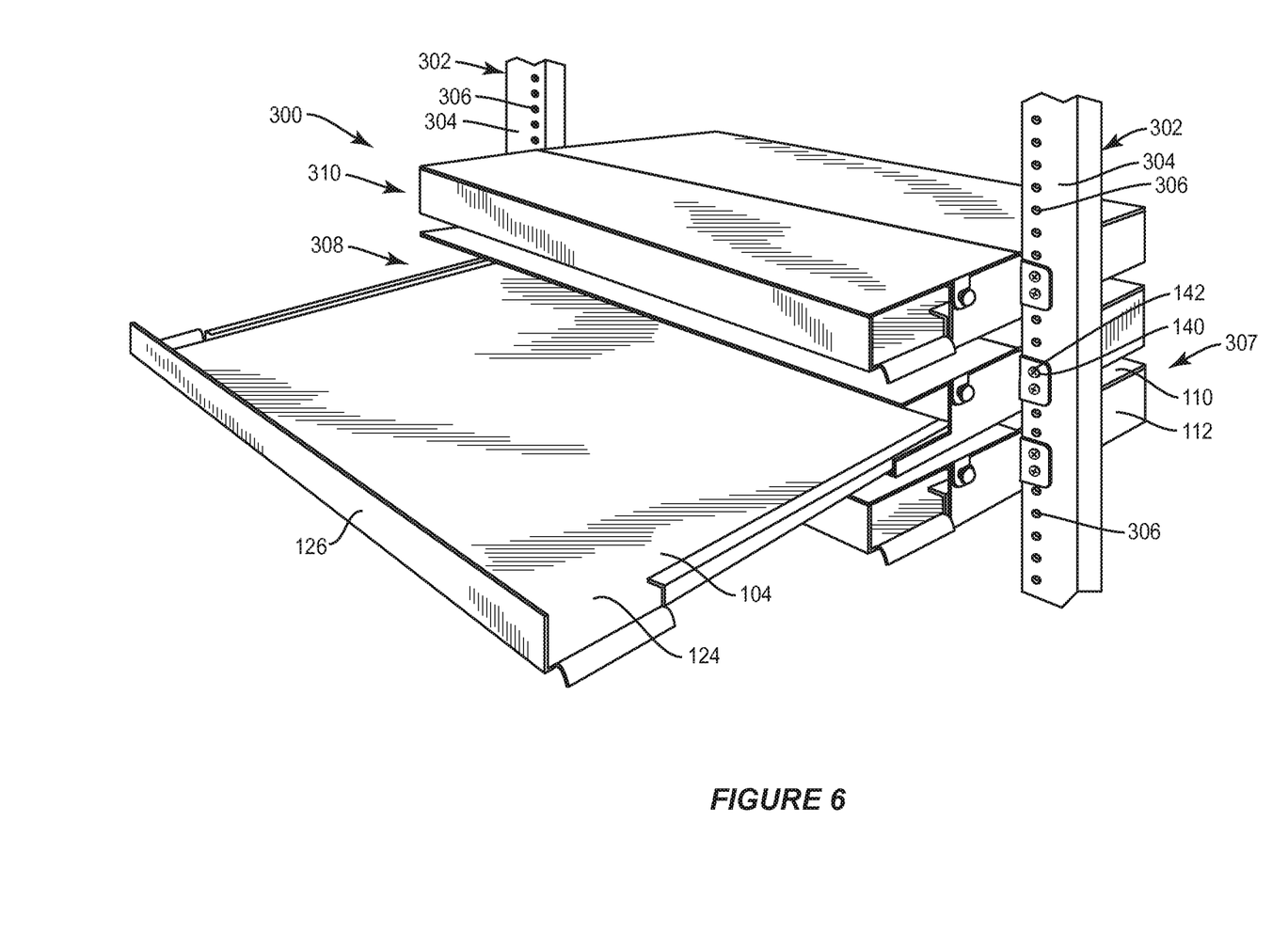
FIG. 6 depicts the rack assembly of FIG. 5 with the drawer of the shelf being completely opened, according to an embodiment.

FIG. 6 depicts the rack assembly 300 of FIG. 3 with the drawer 104 of the middle shelf 308 completely opened. That is, the drawer 104 of the middle shelf 308 is moved away from the rear sidewall 114 of the receptacle 102 as far as possible with the tracks 106 still being engaged with the side-rails 108. In this position, there is a region of the floor 124 that is covered by the roof 110. The drawer 104 cannot be completely uncovered from the roof 110 because the tracks 108 and the side rails 108 must remain engaged in at least a section to maintain physical support of the drawer 104. Thus, in the completely open position, a rear section of the drawer 104 is covered by the roof 110, and is difficult to access by an installer without special tools.

Figure 7:
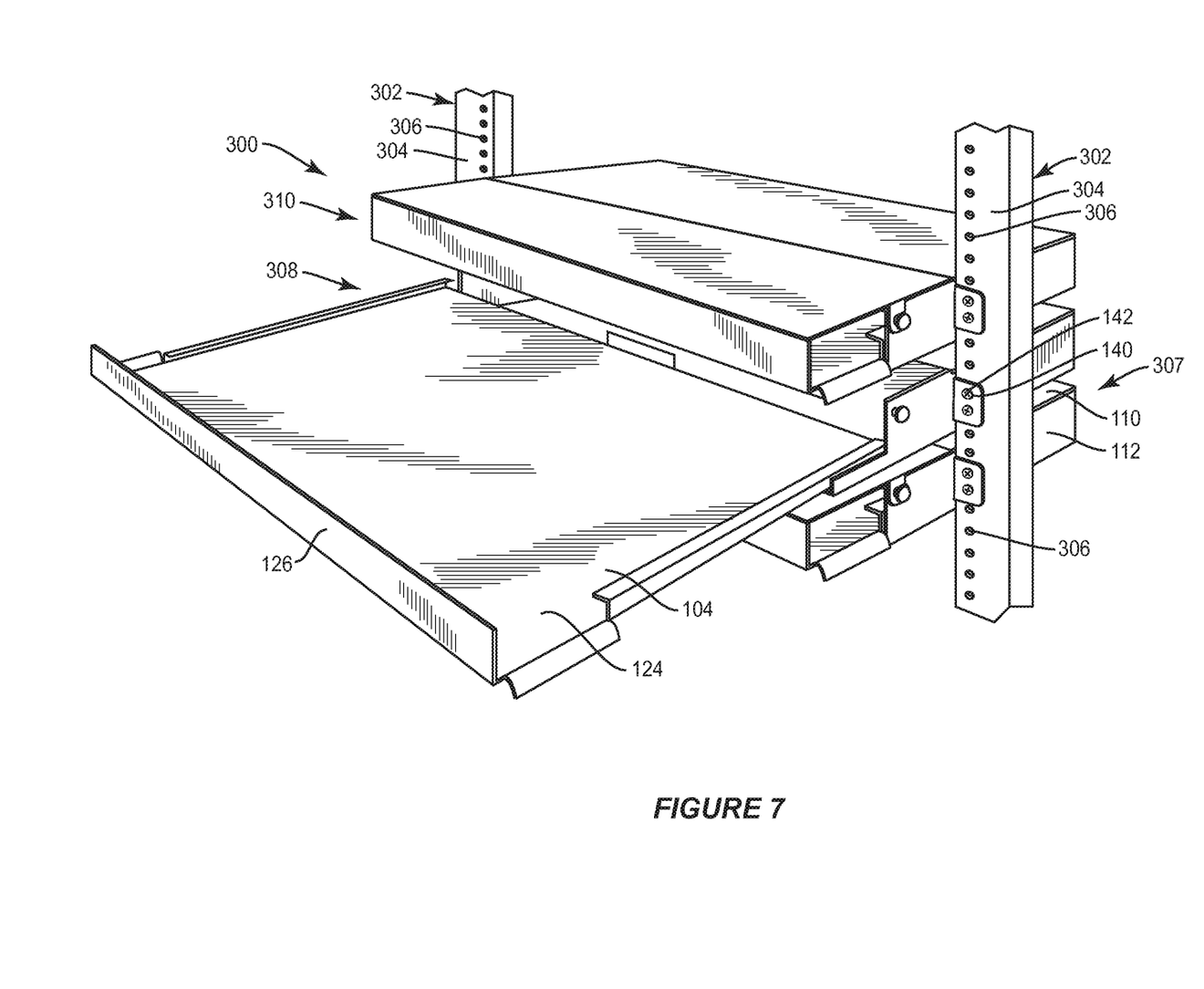
FIG. 7 depicts the rack assembly of FIG. 5 with the drawer of the shelf being completely opened and the removable front access panel being removed from the shelf, according to an embodiment.

FIG. 7 depicts the rack assembly 300 with the drawer 104 of the middle shelf 308 completely opened and the removable front access panel 116 removed from the receptacle 102 in the manner previously discussed. The removal of the removable front access panel 116 alleviates the drawback that the rear portion of the floor 124 is difficult to access by an installer because it provides extra clearance for an installer to access this area.

The geometry and configuration of the tabs 120 and the slats 130 of the removable front access panel 116 are particularly advantageous in the depicted rack assembly 300 in which the middle shelf 308 is covered by the vertically adjacent shelf 308. In this rack assembly 300, there is little or no clearance between the roof 110 of the middle shelf 308 and a bottom of the vertically adjacent shelf 308. Thus, if the mechanism for fixedly attaching the removable front access panel 116 to the permanent section 118 were to be arranged on the roof 110, it may be difficult or impossible to secure and remove the removable front access panel 116. The presently disclosed shelf 100 address this issue by locating the tabs 120 and the corresponding fastener perforations 132 on sides of the shelf 100 that are freely accessible in the vertical rack assembly 300. Thus, there is nothing to impede access to the fasteners 132 that secure the tabs 120 to the first and second outer sidewalls 112. Further, the offset configuration of the first and second sidewalls outer sidewalls 112 of the shelf 100 provides an opening that allows an installer to grip the removable front access panel 116 despite the fact that the vertically adjacent shelf 308 covers the middle shelf 308.

Thus, the removable front access panel 116 offers a low-cost solution to the problem of designing a shelf that is compatible with the rack assembly 300 while providing a drawer that is easily accessible. Because the roof 110 can be formed using a single piece of sheet metal and dividing the single piece into two sections (e.g., by cutting or breaking), the roof 110 can be manufactured at minimal expense. Further, because the tabs 120 and slats 130 can easily formed and added to the removable front access panel 116, e.g., by a punching process, the entire solution is highly cost effective in comparison to other solutions which may, for example, address the problem by modifying the configuration of the drawer 104 and/or the mechanism that allows the drawer 104 to be slid away from the receptacle 102.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity, the term "substantially" encompasses any of these deviations.

Directional terminology, such as "top," "bottom," "front," "back," "upper," "lower," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A shelf for storing fiber optic hardware or cabling, the shelf comprising:
   a receptacle, comprising:
      first and second outer sidewalls spaced apart and parallel to one another;
      a rear sidewall extending between the first and second outer sidewalk;
      a pair of tracks extending along lower edge sides of the first and second sidewalls and facing one another; and
      a roof extending between upper edge sides of the first, second and rear sidewalls, wherein the roof comprises a permanent section and a removable front access panel, the permanent section adjoining the rear sidewall, and the removable front access panel being spaced apart from the rear sidewall by the permanent section;
   a drawer, comprising:
      a floor;
      two side-rails extending along opposite edge sides of the floor; and
      a front panel extending away from a front edge side of the floor and being substantially perpendicular to the floor;
   wherein the receptacle is configured to slidably receive the drawer with the tracks being engaged with the side-rails, and
   wherein the removable front access panel of the receptacle comprises a pair of slats configured to engage with the permanent section of the roof and a pair of tabs configured to fixedly attach the removable front access panel to the first and second outer sidewalls of the receptacle, wherein the first and second outer sidewalls of the receptacle each comprise fastener perforations, wherein the tabs comprise fastener receptacles that align with the fastener perforations of the first and second outer sidewalls when the removable front access panel is engaged with the permanent section of the roof, and wherein the fastener receptacles of the tabs are configured in a hook shape with an open side that faces the rear sidewall of the receptacle so as to allow the removable front access panel to slide in a first direction with a fastener inserted in one of the fastener perforations, the first direction being parallel to the permanent section of the roof.

2. The shelf of claim 1, wherein the tabs are arranged on outer edge sides of the removable front access panel and extend perpendicular to a planar section of the front access panel.

3. The shelf of claim 2, wherein the slats and the tabs of the removable front access panel are configured such that the removable front access panel may be disengaged with the permanent section and removed from the receptacle by sliding the removable front access panel in the first direction.

4. The shelf of claim 1, wherein the fastener is a screw or bolt.

5. The shelf of claim 1, wherein the removable front access panel and the permanent section form a single plane when the removable front access panel is engaged with the permanent section of the roof and fastened to the first and second outer sidewalls, and wherein the slats are offset from the single plane.

6. The shelf of claim 1, wherein front edges of the first and second outer sidewalls are offset from a front side of the rails that is opposite the rear sidewall of the receptacle such that an underside of the removable front access panel is accessible when the removable front access panel is engaged with the permanent section of the roof and fastened to the first and second outer sidewalls and the drawer is completely shut.

7. The shelf of claim 6, wherein the drawer is completely shut when the front panel is flush against the rails or the removable front access panel.

8. A rack assembly for storing fiber optic hardware or cabling, the rack assembly comprising:
a frame, comprising two spaced apart members, each of the members comprising an array of fastener perforations, the fastener perforations being spaced apart from one another at regular intervals;
a plurality of shelves being fixedly attached to the frame by fasteners secured in the fastener perforations of each spaced apart member; a first one of the shelves comprising:
a receptacle, comprising first and second outer sidewalls spaced apart and parallel to one another, a rear sidewall extending between the first and second outer sidewalls, a pair of tracks extending along lower edge sides of the first and second sidewalls and facing one another; and a roof extending between upper edge sides of the first, second and rear sidewalls, wherein the roof comprises a permanent section and a removable access panel, the permanent section adjoining the rear sidewall, and the removable front access panel being spaced apart from the rear sidewall by the permanent section; and
a drawer, comprising a floor, two side-rails extending along opposite edge sides of the floor, and a front panel extending away from a front edge side of the floor and being substantially perpendicular to the floor, wherein the receptacle is configured to slidably receive the drawer with the tracks being engaged with the side-rails;

wherein the first shelf is covered by a vertically adjacent shelf and spaced apart from the vertically adjacent shelf by a minimum separation distance that is determined by a vertical spacing of the fastener perforations on the frame, and wherein the removable front access panel comprises a pair of tabs configured to fixedly attach the removable front access panel to the first and second outer sidewalls of the receptacle and to allow the removable front access panel to be slid away from the rear sidewall of the receptacle in a first direction that is parallel to the permanent section of the roof, wherein the first and second outer sidewalk of the receptacle each comprise fastener perforations, wherein the tabs comprise fastener receptacles that align with the fastener perforations of the first and second outer sidewalls when the removable front access panel is engaged with the permanent section of the roof, and wherein the fastener receptacles of the tabs are configured in a hook shape with an open side that faces the rear sidewall of the receptacle so as to allow the removable front access panel to slide in a first direction with a fastener inserted in one of the fastener perforations, the first direction being parallel to the permanent section of the roof.

9. The rack assembly of claim 8, wherein the pair of tabs of the removable front access panel are arranged on outer edge sides of the removable front access panel and extend perpendicular to a planar section of the front access panel.

10. The rack assembly of claim 8, wherein the fastener is a screw or bolt.

11. The rack assembly of claim 8, wherein the minimum separation distance is less than or equal to 50 millimeters.

12. A shelf for storing fiber optic hardware or cabling, the shelf comprising:
a receptacle, comprising:
first and second outer sidewalls spaced apart and parallel to one another;
a rear sidewall extending between the first and second outer sidewalls;
a pair of tracks extending along lower edge sides of the first and second sidewalk and facing one another; and
a roof extending between upper edge sides of the first, second and rear sidewalls, wherein the roof comprises a permanent section and a removable front access panel, the permanent section adjoining the rear sidewall, and the removable front access panel being spaced apart from the rear sidewall by the permanent section;
a drawer, comprising:
a floor;
two side-rails extending along opposite edge sides of the floor; and
a front panel extending away from a front edge side of the floor and being substantially perpendicular to the floor;

wherein the receptacle is configured to slidably receive the drawer with the tracks being engaged with the side-rails, wherein the removable front access panel of the receptacle comprises a pair of slats configured to engage with the permanent section of the roof and a pair of tabs configured to fixedly attach the removable front access panel to the first and second outer sidewalk of the receptacle, wherein the tabs are arranged on outer edge sides of the removable front access panel and extend perpendicular to a planar section of the front access panel, and wherein the tabs comprise fastener receptacles that are configured in a hook shape with an open side that faces the rear sidewall of the receptacle.

* * * * *